US008088561B2

(12) United States Patent
Andriessen et al.

(10) Patent No.: US 8,088,561 B2
(45) Date of Patent: Jan. 3, 2012

(54) METHOD OF MAKING A LITHOGRAPHIC PRINTING PLATE

(75) Inventors: Hieronymus Andriessen, Beerse (BE); Hubertus Van Aert, Pulderbos (BE); Alexander Williamson, Mortsel (BE); Marc Van Damme, Bonheiden (BE)

(73) Assignee: Agfa Graphics NV, Mortsel (BE)

( * ) Notice: Subject to any disclaimer, the term of this patent is extended or adjusted under 35 U.S.C. 154(b) by 793 days.

(21) Appl. No.: 12/094,291

(22) PCT Filed: Nov. 23, 2006

(86) PCT No.: PCT/EP2006/068826

§ 371 (c)(1), (2), (4) Date: May 20, 2008

(87) PCT Pub. No.: WO2007/060200

PCT Pub. Date: May 31, 2007

(65) Prior Publication Data

US 2008/0307990 A1 Dec. 18, 2008

Related U.S. Application Data

(60) Provisional application No. 60/751,556, filed on Dec. 19, 2005.

(30) Foreign Application Priority Data

Nov. 24, 2005 (EP) .................................... 05077662

(51) Int. Cl.
*G03F 7/26* (2006.01)
*G03F 7/30* (2006.01)

(52) U.S. Cl. ..................... 430/302; 430/270.1; 430/908; 430/910

(58) Field of Classification Search .................. 430/300, 430/302, 270.1, 908, 910
See application file for complete search history.

(56) References Cited

U.S. PATENT DOCUMENTS 3,696,745 A * 10/1972 Morton ...................... 101/415.1
4,873,174 A 10/1989 Dhillon et al.
5,037,961 A 8/1991 Nuyken et al.
5,985,514 A 11/1999 Zheng et al.
6,153,352 A * 11/2000 Oohashi et al. ............ 430/270.1
6,300,032 B1 * 10/2001 Van Damme et al. ........ 430/188
6,455,230 B1 9/2002 Damme et al.
6,641,970 B2 * 11/2003 Van Damme et al. ........ 430/164
6,645,699 B2 * 11/2003 Verschueren et al. ........ 430/302
2003/0170570 A1 * 9/2003 Vander Aa et al. ........... 430/302
2010/0040976 A1 * 2/2010 Callant et al. .............. 430/283.1
2010/0221662 A1 * 9/2010 Callant et al. .............. 430/281.1

FOREIGN PATENT DOCUMENTS

EP 0 507 008 A1 10/1992
EP 0 652 483 A1 5/1995
EP 0 771 645 A1 5/1997
EP 0 960 729 A1 12/1999
EP 0 980 754 A1 2/2000
EP 1 084 861 A2 3/2001
EP 1 267 211 A1 12/2002
EP 1 342 568 A1 9/2003
WO 92/09934 A1 6/1992
WO 02/101469 A1 12/2002
WO 2005/111727 A1 11/2005

OTHER PUBLICATIONS

Official communication issued in the International Application No. PCT/EP2006/068826, mailed on Jan. 30, 2007.

* cited by examiner

*Primary Examiner* — Anca Eoff
(74) *Attorney, Agent, or Firm* — Keating & Bennett, LLP

(57) ABSTRACT

A method of making a lithographic printing plate includes the steps of: a) providing a lithographic printing plate precursor including (i) a support having a hydrophilic surface or which is provided with a hydrophilic layer, (ii) a coating on the support including an imaging layer, and, optionally, an intermediate layer between the imaging layer and the support, wherein the imaging layer includes a switchable polymer, b) image-wise exposing the coating, whereby the polymer undergoes a chemical reaction induced by the exposing step thereby creating a lithographic image consisting of printing areas and non-printing areas wherein the non-printing areas are removable from the support by a gum solution, and c) developing the precursor by treating the coating of the precursor with the gum solution thereby removing the non-printing areas.

15 Claims, No Drawings

METHOD OF MAKING A LITHOGRAPHIC PRINTING PLATE

CROSS-REFERENCE TO RELATED APPLICATIONS

This application is a 371 of PCT/EP2006/068826, filed Nov. 23, 2006. This application claims the benefit of U.S. Provisional Application No. 60/751,556, filed Dec. 19, 2005, which is incorporated by reference herein in its entirety. In addition, this application claims the benefit of European Application No. 05077662.4, filed Nov. 24, 2005, which is also incorporated by reference herein in its entirety.

BACKGROUND OF THE INVENTION

1. Field of the Invention

The present invention relates to a method for making a lithographic printing plate whereby a printing plate precursor including a switchable polymer is image-wise exposed and treated with a gum solution and the plate is developed and gummed in a single step.

2. Description of the Related Art

In lithographic printing, a so-called printing master such as a printing plate is mounted on a cylinder of the printing press. The master carries a lithographic image on its surface and a printed copy is obtained by applying ink to the image and then transferring the ink from the master onto a receiver material, which is typically paper. In conventional, so-called "wet" lithographic printing, ink as well as an aqueous fountain solution (also called dampening liquid) are supplied to the lithographic image which consists of oleophilic (or hydrophobic, i.e., ink-accepting, water-repelling) areas as well as hydrophilic (or oleophobic, i.e., water-accepting, ink-repelling) areas. In so-called "driographic" printing, the lithographic image consists of ink-accepting and ink-adhesive (ink-repelling) areas and during driographic printing, only ink is supplied to the master.

Printing masters are generally obtained by the so-called computer-to-film (CtF) method, wherein various pre-press steps such as typeface selection, scanning, color separation, screening, trapping, layout, and imposition are accomplished digitally and each color selection is transferred to graphic arts film using an image-setter. After processing, the film can be used as a mask for the exposure of an imaging material called a plate precursor and after plate processing, a printing plate is obtained which can be used as a master. Since about 1995, the so-called 'computer-to-plate' (CtP) method has gained a lot of interest. This method, also called 'direct-to-plate', bypasses the creation of film because the digital document is transferred directly to a printing plate precursor by means of a so-called plate-setter. A printing plate precursor for CtP is often called a digital plate.

Digital plates can roughly be divided into three categories: (i) silver plates, which work according to the silver salt diffusion transfer mechanism; (ii) photopolymer plates which contain a photopolymerizable composition that hardens upon exposure to light; and (iii) thermal plates of which the imaging mechanism is triggered by heat or by light-to-heat conversion. Thermal plates are mainly sensitized for infrared lasers emitting at 830 nm or 1064 nm. Laser sources have been increasingly used to expose a printing plate precursor which is sensitized to a corresponding laser wavelength. Typically, an infrared laser diode emitting around 830 nm or a Nd-YAG laser emitting around 1060 nm can be used.

In the thermal plate, the material is exposed to heat or to infrared light and the generated heat triggers a (physico-) chemical process, such as ablation, polymerization, insolubilization by cross-linking of a polymer or by particle coagulation of a thermoplastic polymer latex, and solubilization by the destruction of intermolecular interactions or by increasing the penetrability of a development barrier layer. Most thermal plates form an image by a heat-induced solubility difference in an alkaline developer between exposed and non-exposed areas of the coating. The plates are usually processed in an alkaline developer having a pH>10. During processing, the solubility differential leads to the removal of the non-image (non-printing) areas of the coating, thereby revealing the hydrophilic support, while the image (printing) areas of the coating remain on the support. Currently, most commercial lithographic plates require an additional gumming process after the exposed plate is developed and before it is put on the press, in order to protect the plate from contamination, e.g., by oxidation, fingerprints, fats, oil or dust, or from damaging, e.g., by scratches during handling of the plate. Especially the non-printing areas defined by the revealed hydrophilic support are very sensitive to contamination or damaging and need to be protected by a gum. Such a wet processing step by an alkaline developer and such an additional gumming step are not convenient for the end-user because it is a time consuming step and requires two wet stations, a processing station and a gumming station.

Thermally switchable polymers have been disclosed for use as an imaging material in processless printing plates wherein no wet processing is required for obtaining the lithographic differentiation between the ink-accepting areas and fountain solution-accepting areas and wherein no gumming is needed to protect the non-printing areas. By "switchable," it is meant that the polymer, upon exposure to heat, is changed either from hydrophobic to more hydrophilic (or oleophobic) for a negative-working plate or from hydrophilic to more hydrophobic (or oleophilic) for a positive-working plate.

Polymer coatings which undergo a change in surface properties in response to light exposure are known in the art. WO92/09934 discloses coatings that become hydrophilic as a result of irradiation to UV/visible light and that include a photochemical source of a strong acid and an acid-sensitive polymer, derived from a cyclic acetal ester of (meth)acrylic acid such as tetrahydropyranyl(meth)acrylate. There is no disclosure of laser addressability.

EP-A 652 483 discloses a lithographic printing plate requiring no dissolution processing which includes a substrate bearing a heat-sensitive coating including a photothermal converter, which coating becomes relatively more hydrophilic under the action of heat.

EP-A 980 754 discloses a method for making a lithographic printing plate whereby the precursor, including a photothermal converter and a polymer having at least either carboxylic acid or carboxylate groups capable of causing thermal decarboxylation, is exposed by IR-laser.

EP-A 1 084 861 discloses a positive-working imaging member composed of a heat-sensitive surface imageable layer having a heat-sensitive sulphonate polymer and a photothermal conversion material. Upon application of thermal energy, the sulphonate groups decompose rendering exposed areas more hydrophilic. The exposed imaging member can be contacted with a lithographic printing ink and used for printing without post-imaging wet processing.

U.S. Pat. No. 5,985,514 discloses an imaging member composed of a hydrophilic imaging layer, having a hydrophilic heat-sensitive polymer containing heat-activatable thiosulphate groups, and optionally, a photothermal conversion material. Upon application of thermal energy, the polymer is crosslinked and rendered more hydrophobic. The exposed imaging member can be contacted with a lithographic printing ink and a fountain solution and used for printing with or without post-imaging wet processing.

U.S. Pat. No. 6,455,230 discloses a method for making a lithographic printing plate whereby an imaging element is image-wise exposed to a high laser energy. The imaging element includes, on a lithographic hydrophilic support, a heat-sensitive coating including a light-to-heat converting compound and a compound which becomes more hydrophilic under the action of heat.

EP 960 729 discloses a heat-sensitive imaging element for providing a lithographic printing plate which requires no dissolution processing. The imaging element includes a support and as a top layer a heat switchable image forming layer including a light-to-heat converting compound, a hardened binder, and a heat switchable polymer containing aryldiazosulphonate units. The use of compounds or polymers containing aryldiazosulphonate groups in printing plates is also disclosed in EP 507 008, EP 339 393, EP-A 1 267 211, and EP 771 645. In EP-A 1 267 211, the imaging layer includes a polymer having aryldiazosulphonate units and/or aryltriazenylsulphonate units and a compound capable of generating a radical and/or an acid upon exposure to UV light. In EP 771 645, the imaging element, including a polymer containing aryldiazosulphonate units, is image-wise exposed and on-press processed.

In the printing plates of the prior art, the lithographic differentiation between the ink-accepting areas and the fountain solution-accepting areas is formed by a chemical reaction of the switchable polymer upon image-wise exposing and without a dissolution processing. This principle has the disadvantage that the hydrophilic properties of the non-printing areas are insufficiently hydrophilic, whereby fast toning occurs at the non-printing areas. By “toning,” it is understood to mean the tendency of ink-acceptance at non-printing areas during printing.

Another problem for the printing plates in the prior art including a switchable polymer and without a dissolution processing is the lack of a visible image between exposure and processing. Although it is known to add a colorant to the coating, so as to obtain a visible image after removal of the non-printing areas of the coating by the processing, this does not make it possible to distinguish an exposed plate from an unexposed plate immediately after the image-wise exposure, let alone to inspect the image quality after the exposure because the visible image is only revealed after on-press processing or during printing on the press. Moreover, on-press processable plates normally do not contain a colorant because the on-press removal of the non-printing areas of the coating may cause contamination of the fountain solution and/or the ink and it may take an unacceptable number of printed copies before the contamination by the colorant has disappeared.

Another problem associated with on-press processing with fountain solution and ink is an insufficient clean-out of the non-printing areas.

WO 02/101 469 discloses a method of processing an imageable element useful as an alkaline-developable lithographic printing plate precursor wherein the element is developed and gummed with an aqueous alkaline developing-gumming solution including a water-soluble polyhydroxy compound having a specific structure.

EP 1 342 568 discloses a method for making a heat-sensitive lithographic printing plate wherein the image-wise heated precursor, including a coating of hydrophobic thermoplastic polymer particles which coalescence on heating, is developed with a gum solution. A practical preferred embodiment of this type of printing plates was introduced by Agfa under the trade name Azura.

In WO 2005/111727, a method for making a lithographic printing plate is disclosed wherein an image-wise exposed precursor, including a photopolymerizable coating, is developed with a gum solution.

SUMMARY OF THE INVENTION

In order to overcome the problems described above, preferred embodiments of the present invention provide a method for making a lithographic printing plate from a plate precursor, including a switchable polymer, which is perceived by the user as a method which does not require a processing step and wherein the non-printing areas are sufficiently hydrophilic, whereby no toning occurs at the non-printing areas. A preferred embodiment of the present invention includes a method having the specific feature that the precursor, which includes a switchable polymer, is image-wise exposed and is treated with a gum solution whereby the plate is developed and gummed in a single step.

A further preferred embodiment of the present invention provides a method for making a lithographic printing plate from a plate precursor including a switchable polymer, which is perceived by the user as a method which does not require a processing step and wherein a visible image is provided before mounting the plate on the press. This is achieved by adding a colorant to the coating of the plate. Since the non-printing areas of the coating are removed with the gum solution, there is no risk of contamination of the fountain solution or ink during the start of the print job.

Other features, elements, steps, characteristics and advantages of the present invention will become more apparent from the following detailed description of preferred embodiments of the present invention.

DETAILED DESCRIPTION OF THE PREFERRED EMBODIMENTS

In the preferred embodiments of the present invention, the printing plate precursor is image-wise exposed. By image-wise exposing, it is understood that the precursor, including the switchable polymer, is image-wise irradiated by UV light, violet light, visible light, or infrared light, or is image-wise heated by a thermal head or by irradiation by light whereby a light-to-heat converter is preferably present in the coating to generate heat by absorbing irradiated light. In a preferred embodiment, the precursor is image-wise exposed to IR-light whereby an IR-absorbing agent is present in the coating. The IR-absorbing agent is more preferably an IR-dye or IR-pigment, most preferably an IR-dye.

In a preferred embodiment of the present invention, this image-wise exposing is carried out off-press by a plate setter, i.e., a laser exposure apparatus suitable for image-wise exposing a precursor. The laser preferably emits IR-light having a wavelength between 750 and 1500 nm.

The precursor used in a preferred embodiment of the present invention includes a switchable polymer in the imaging layer, and optionally a compound capable of converting the irradiated light into heat.

The switchable polymer is defined as a polymer which is capable of changing its hydrophilic/hydrophobic polarity by a chemical reaction upon exposing, e.g., a hydrophobic polymer which is capable of becoming hydrophilic upon exposure or a hydrophilic polymer which is capable of becoming hydrophobic upon exposure.

In the gum processing step, the plate precursor is treated, i.e., developed and gummed, e.g., in a gumming station which includes at least one gumming unit, preferably two gumming units. In the gumming unit(s), a gum solution is applied to the coating of the precursor whereby the coating at non-printing areas is removed from the support revealing the hydrophilic surface of the support. The development with a gum solution has the additional benefit that, due to the remaining gum on the plate, especially at the non-printing areas where the coating has been removed from the support, an additional gumming step is not required to protect the surface of the support at these areas. As a result, the precursor is processed and gummed in one single step and the obtained lithographic image on the plate will not be affected by ambient daylight or by contamination.

The support is preferably aluminum, more preferably grained and anodized aluminum. The hydrophilic surface is preferably the anodized layer on the aluminum.

The Gum Solution

A gum solution is typically an aqueous liquid which includes one or more surface protective compounds that are capable of protecting the lithographic image of a printing plate against contamination, e.g., by oxidation, fingerprints, fats, oils or dust, or damaging, e.g., by scratches during handling of the plate. Suitable examples of such compounds are film-forming hydrophilic polymers or surfactants. The layer that remains on the plate after treatment with the gum solution preferably includes between 0.005 and 20 $g/m^2$ of the surface protective compound, more preferably between 0.010 and 10 $g/m^2$, most preferably between 0.020 and 5 $g/m^2$.

In the present description, all concentrations of compounds present in the gum solution are expressed as percentage by weight (wt. % or % w/w) relative to the ready-to-use gum solution, unless otherwise indicated. A gum solution is typically supplied as a concentrated solution which is diluted by the end user with water to a ready-to-use gum solution according to the instructions of the supplier. Usually, 1 part of the gum is diluted with 1 part to 10 parts of water.

Preferred polymers for use as a protective compound in the gum solution are gum arabic, pullulan, cellulose derivatives such as carboxymethylcellulose, carboxyethylcellulose or methylcellulose, (cyclo)dextrin, poly(vinyl alcohol), poly(vinyl pyrrolidone), polysaccharide, homo- and copolymers of acrylic acid, methacrylic acid or acrylamide, a copolymer of vinyl methyl ether and maleic anhydride, a copolymer of vinyl acetate and maleic anhydride or a copolymer of styrene and maleic anhydride. Highly preferred polymers are homo- or copolymers of monomers containing carboxylic, sulfonic or phosphonic groups or the salts thereof, e.g., (meth)acrylic acid, vinyl acetate, styrene sulfonic acid, vinyl sulfonic acid, vinyl phosphonic acid, or acrylamidopropane sulfonic acid.

Examples of surfactants for use as a surface protective agent include anionic or nonionic surfactants. The gum solution may also include one or more of the above hydrophilic polymers as the surface protective agent and, in addition, one or more surfactants to improve the surface properties of the coated layer. The surface tension of the gum solution is preferably from 20 to 50 mN/m.

The gum solution includes preferably an anionic surfactant, more preferably an anionic surfactant wherein the anionic group is a sulphonic acid group.

Examples of the anionic surfactant include aliphates, abietates, hydroxyalkanesulfonates, alkanesulfonates, dialkylsulfosuccinates, straight-chain alkylbenzenesulfonates, branched alkylbenzenesulfonates, alkylnaphthalenesulfonates, alkylphenoxypolyoxyethylenepropylsulfonates, salts of polyoxyethylene alkylsulfophenyl ethers, sodium N-methyl-N-oleyltaurates, monoamide disodium N-alkylsulfosuccinates, petroleum sulfonates, sulfated castor oil, sulfated tallow oil, salts of sulfuric esters of aliphatic alkylesters, salts of alkylsulfuric esters, sulfuric esters of polyoxyethylenealkylethers, salts of sulfuric esters of aliphatic monoglycerides, salts of sulfuric esters of polyoxyethylenealkylphenylethers, salts of sulfuric esters of polyoxyethylenestyrylphenylethers, salts of alkylphosphoric esters, salts of phosphoric esters of polyoxyethylenealkylethers, salts of phosphoric esters of polyoxyethylenealkylphenylethers, partially saponified compounds of styrenemaleic anhydride copolymers, partially saponified compounds of olefin-maleic anhydride copolymers, and naphthalenesulfonateformalin condensates. Particularly preferred among these anionic surfactants are dialkylsulfosuccinates, salts of alkylsulfuric esters, and alkylnaphthalenesulfonates.

Specific examples of suitable anionic surfactants include sodium dodecylphenoxybenzene disulfonate, the sodium salt of alkylated naphthalenesulfonate, disodium methylene-dinaphtalene-disulfonate, sodium dodecyl-benzenesulfonate, sulfonated alkyl-diphenyloxide, ammonium or potassium perfluoroalkylsulfonate, and sodium dioctyl-sulfosuccinate.

Suitable examples of the nonionic surfactants include polyoxyethylene alkyl ethers, polyoxyethylene alkyl aryl ethers wherein the aryl group may be a phenyl group, a naphthyl group or an aromatic heterocyclic group, polyoxyethylene polystyryl phenyl ethers, polyoxyethylene polyoxypropylene alkyl ethers, polyoxyethylene polyoxypropylene block polymers, partial esters of glycerinaliphatic acids, partial esters of sorbitanaliphatic acid, partial esters of pentaerythritolaliphatic acid, propyleneglycolmonoaliphatic esters, partial esters of sucrosealiphatic acids, partial esters of polyoxyethylenesorbitanaliphatic acid, partial esters of polyoxyethylenesorbitolaliphatic acids, polyethyleneglycolaliphatic esters, partial esters of poly-glycerinaliphatic acids, polyoxyethylenated castor oils, partial esters of polyoxyethyleneglycerinaliphatic acids, aliphatic diethanolamides, N,N-bis-2-hydroxyalkylamines, polyoxyethylene alkylamines, triethanolaminealiphatic esters, and trialkylamine oxides. Particularly preferred among these nonionic surfactants are polyoxyethylene alkylphenyl ethers, polyoxyethylene alkylnaphthyl ethers and poloxyethylene-polyoxypropylene block polymers. Further, fluorinic and siliconic anionic and nonionic surfactants may be similarly used.

Two or more of the above surfactants may be used in combination. For example, a combination of two or more different anionic surfactants or a combination of an anionic surfactant and a nonionic surfactant may be preferred. The amount of such a surfactant is not specifically limited but is preferably from 0.01 to 30 wt. %, more preferably from 0.05 to 20 wt. %.

According to a preferred embodiment of the present invention, the gum solution has a pH-value preferably between 3 and 9, more preferably between 4.5 and 8.5, most preferably between 5 and 7. The pH of the gum solution is usually adjusted with a mineral acid, an organic acid, or an inorganic salt in an amount of from 0.01 to 15 wt. %, preferably from 0.02 to 10 wt. %. Examples of the mineral acids include nitric acid, sulfuric acid, phosphoric acid, and metaphosphoric acid. Especially organic acids are used as pH control agents and as desensitizing agents. Examples of the organic acids include carboxylic acids, sulfonic acids, phosphonic acids or salts thereof, e.g., succinates, phosphates, phosphonates, sulfates, and sulfonates. Specific examples of the organic acid include citric acid, acetic acid, oxalic acid, malonic acid, p-toluenesulfonic acid, tartaric acid, malic acid, lactic acid, levulinic acid, phytic acid, and organic phosphonic acid.

The gum solution further includes preferably an inorganic salt. Examples of the inorganic salt include magnesium nitrate, monobasic sodium phosphate, dibasic sodium phosphate, nickel sulfate, sodium hexametaphosphate, and sodium tripolyphosphate. An alkali-metal dihydrogen phosphate such as $KH_2PO_4$ or $NaH_2PO_4$ is most preferred. Other inorganic salts can be used as corrosion inhibiting agents, e.g., magnesium sulfate or zinc nitrate. The mineral acid, organic acid, or inorganic salt may be used singly or in combination with one or more thereof.

In accordance with another preferred embodiment of the present invention, the gum solution as a developer in the processing of the plate includes preferably a mixture of an anionic surfactant and an inorganic salt. In this mixture, the anionic surfactant is preferably an anionic surfactant with a sulphonic acid group, more preferably an alkali-metal salt of a mono- or di-alkyl substituted diphenylether-sulphonic acid, and the inorganic salt is preferably a mono or dibasic phosphate salt, more preferably an alkali-metal dihydrogen phosphate, most preferably $KH_2PO_4$ or $NaH_2PO_4$.

In accordance with another preferred embodiment of the present invention, the gum solution including a mixture of an anionic surfactant and an inorganic salt preferably has a pH-value between 3 and 9, more preferably between 4 and 8, most preferably between 5 and 7.

Besides the foregoing components, a wetting agent such as ethylene glycol, propylene glycol, triethylene glycol, butylene glycol, hexylene glycol, diethylene glycol, dipropylene glycol, glycerin, trimethylol propane, and diglycerin may also be present in the gum solution. The wetting agent may be used singly or in combination with one or more thereof. In general, the foregoing wetting agent is preferably used in an amount of from 1 to 25 wt. %.

Further, a chelate compound may be present in the gum solution. Calcium ion and other impurities contained in the diluting water can have adverse effects on printing and thus cause the contamination of printed matter. This problem can be eliminated by adding a chelate compound to the diluting water. Preferred examples of such a chelate compound include organic phosphonic acids or phosphonoalkanetricarboxylic acids. Specific examples are potassium or sodium salts of ethylenediaminetetraacetic acid, diethylenetriaminepentaacetic acid, triethylenetetraminehexaacetic acid, hydroxyethylethylenediaminetriacetic acid, nitrilotriacetic acid, 1-hydroxyethane-1,1-diphosphonic acid, and aminotri (methylenephosphonic acid). Besides these sodium or potassium salts of these chelating agents, organic amine salts are useful. The preferred amount of such a chelating agent to be added is from 0.001 to 5 wt. % relative to the gum solution in diluted form.

Further, an antiseptic and an anti-foaming agent may be present in the gum solution. Examples of such an antiseptic include phenol, derivatives thereof, formalin, imidazole derivatives, sodium dehydroacetate, 4-isothiazoline-3-one derivatives, benzoisothiazoline-3-one, benztriazole derivatives, amidineguanidine derivatives, quaternary ammonium salts, pyridine derivatives, quinoline derivatives, guanidine derivatives, diazine, triazole derivatives, oxazole and oxazine derivatives. The preferred amount of such an antiseptic to be added is such that it can exert a stable effect on bacteria, fungi, yeast or the like. Though depending on the kind of bacteria, fungi and yeast, it is preferably from 0.01 to 4 wt. % relative to the gum solution in diluted form. Further, preferably, two or more antiseptics may be used in combination to exert an aseptic effect on various fungi and bacteria. The anti-foaming agent is preferably silicone anti-foaming agents. Among these anti-foaming agents, either an emulsion dispersion type or solubilized type anti-foaming agent may be used. The proper amount of such an anti-foaming agent to be added is from 0.001 to 1.0 wt. % relative to the gum solution in diluted form.

Besides the foregoing components, an ink receptivity agent may be present in the gum solution if desired. Examples of such an ink receptivity agent include turpentine oil, xylene, toluene, low heptane, solvent naphtha, kerosene, mineral spirit, hydrocarbons such as petroleum fraction having a boiling point of about 120° C. to about 250° C., diester phthalates (e.g., dibutyl phthalate, diheptyl phthalate, di-n-octyl phthalate, di(2-ethylhexyl)phthalate, dinonyl phthalate, didecyl phthalate, dilauryl phthalate, butylbenzyl phthalate), aliphatic dibasic esters (e.g., dioctyl adipate, butylglycol adipate, dioctyl azelate, dibutyl sebacate, di(2-ethylhexyl)sebacate dioctyl sebacate), epoxidated triglycerides (e.g., epoxy soybean oil), ester phosphates (e.g., tricresyl phosphate, trioctyl phosphate, trischloroethyl phosphate) and plasticizers having a solidification point of 15° C. or less and a boiling point of 300° C. or more at one atmospheric pressure such as esters of benzoates (e.g., benzyl benzoate). Examples of other solvents which can be used in combination with these solvents include ketones (e.g., cyclohexanone), halogenated hydrocarbons (e.g., ethylene dichloride), ethylene glycol ethers (e.g., ethylene glycol monomethyl ether, ethylene glycol monophenyl ether, ethylene glycol monobutyl ether), aliphatic acids (e.g., caproic acid, enathic acid, caprylic acid, pelargonic acid, capric acid, undecylic acid, lauric acid, tridecylic acid, myristic acid, pentadecylic acid, palmitic acid, heptadecylic acid, stearic acid, nonadecanic acid, arachic acid, behenic acid, lignoceric acid, cerotic acid, heptacosanoic acid, montanic acid, melissic acid, lacceric acid, isovaleric acid) and unsaturated aliphatic acids (e.g., acrylic acid, crotonic acid, isocrotonic acid, undecyclic acid, oleic acid, elaidic acid, cetoleic acid, erucic acid, butecidic acid, sorbic acid, linoleic acid, linolenic acid, arachidonic acid, propiolic acid, stearolic acid, clupanodonic acid, tariric acid, licanic acid). Preferably, it is an aliphatic acid which is liquid at a temperature of 50° C., more preferably has from 5 to 25 carbon atoms, most preferably has from 8 to 21 carbon atoms. The ink receptivity agent may be used singly or in combination with one or more thereof. The ink receptivity agent is preferably used in an amount of from 0.01 to 10 wt. %, more preferably from 0.05 to 5 wt. %. The foregoing ink receptivity agent may be present as an oil-in-water emulsion or may be solubilized with the aid of a solubilizing agent.

The viscosity of the gum solution can be adjusted to a value ranging preferably between 1.0 and 5 mPa·s, more preferably between 1.7 and 5 mPa·s, most preferably between 2.0 and 4.5 mPa·s, by adding viscosity increasing compounds, such as poly(ethylene oxide) or polyvinylalcohol, e.g., having a molecular weight between 104 and 107. Such compounds can be present in a concentration of 0.01 to 10 g/l.

A baking gum has a similar composition as described above, with the additional preference towards compounds that do not evaporate at the usual bake temperatures. Baking gum solutions or baking gumming solutions can be aqueous solutions of sodium dodecyl phenoxy benzene disulphonate, alkylated naphthalene sulphonic acid, sulphonated alkyl diphenyl oxide, methylene dinaphtalene sulphonic acid, etc. Other gumming solutions contain a hydrophilic polymer component and an organic acid component. Still other baking gumming solutions contain the potassium salt of the hydroxyethylidene diphosphonic acid. Still other baking gumming solutions contain a sulphosuccinamate compound and phosphoric acid.

The contact angle between the baking gum solution and the plate is preferably lowered by adding at least one surfactant. Preferred surfactants are non-ionic polyglycols and perfluorated aliphatic polyester acrylates.

The viscosity of the baking gum solution has a value ranging preferably between 1.0 and 5 mPa·s, more preferably between 1.7 and 5 mPa·s, most preferably between 2.0 and 4.5 mPa·s, by adding at least one viscosity increasing compound. Preferred viscosity increasing compounds are hydrophilic polymer compounds, more preferably polyethylene oxides. The polyethylene oxides have preferably a molecular weight between 100,000 and 10,000,000, more preferably between 500,000 and 5,000,000. They are preferably used in a concentration of 0.01 to 10 g/l, more preferably of 0.05 to 5 g/l.

In another preferred embodiment, the baking gumming solutions include (a) water, (b) at least one hydrophilic polymer, and (c) at least one component selected from water soluble organic acids including at least two acid functions and being selected from benzene carboxylic acid, a benzene sulphonic acid, a benzene phosphonic acid, an alkane phosphonic acid and water soluble salts thereof. The mentioned compounds (b) and (c) which are dissolved in the aqueous solution in accordance with a preferred embodiment of the present invention are such that they do not evaporate at the customary baking temperatures. The protective layer which is formed remains water-soluble, even after baking, and can be readily removed without damaging the printing plate.

Component (b) includes, in particular, the following hydrophilic polymers: N-polyvinyl-pyrrolidone, polyvinylmethylether, copolymers containing ethylene units and maleic anhydride units, homopolymers or copolymers containing vinyl phosphonic acid units, vinyl methyl phosphinic acid units and/or acrylic acid units and/or a polyalkylene glycol, such as polyethylene glycol.

Component (c) includes in particular: benzene disulphonic acids, benzene polycarboxylic acids having from 3 to 6 carboxyl groups, alkane diphosphonic acids which having from 1 to 3 carbon atoms in the alkane group, carboxyl group containing alkane diphosphonic acids which have from 5 to 9 carbon atoms in the alkane group, and/or one of the water-soluble salts of these acids (preferably alkali metal salts or ammonium salts). Specific examples of component (c) include benzene-1,3-disulphonic acid, benzene-1,2,4-tricarboxylic acid (trimellitic acid), benzene 1,2,4,5-tetracarboxylic acid (pyromellitic acid), benzene hexacarboxylic acid (mellitic acid), methane diphosphonic acid (diphosphono methane), 4,4-diphosphono-heptane-1,7-dioic acid (3,3-diphosphone-pimeic acid), and the sodium salts of these acids. In other preferred embodiments, the baking gumming solution can additionally contain hydroxy-polycarboxylic acids, such as citric acid and/or the salts thereof, water soluble alkanediols having at least 4 carbon atoms, such as hexanediol-(1,6) and surfactants (preferably anionic or non-ionic surfactants) such as alkyl aryl sulphonates, alkyl phenol ether sulphonates, and a natural surfactant (e.g., Saponin). Specific examples of suitable baking gum solutions, ingredients and concentrations thereof, can be found in, e.g., EP-A 222 297, EP-A 1 025 992, DE-A 2 626 473, and U.S. Pat. No. 4,786,581.

The Support

A particularly preferred lithographic support is an electrochemically grained and anodized aluminum support. Graining and anodizing of aluminum supports is well known. The acid used for graining can be, e.g., nitric acid or sulfuric acid. The acid used for graining preferably includes hydrogen chloride. Also mixtures of, e.g., hydrogen chloride and acetic acid can be used. The relationship between electrochemical graining and anodizing parameters such as electrode voltage, nature, and concentration of the acid electrolyte or power consumption on the one hand and the obtained lithographic quality in terms of Ra and anodic weight (g/m$^2$ of $Al_2O_3$ formed on the aluminum surface) on the other hand is well known. More details about the relationship between various production parameters and Ra or anodic weight can be found in, e.g., the article "Management of Change in the Aluminium Printing Industry" by F. R. Mayers, published in the ATB Metallurgie Journal, Volume 42 No. 1-2, (2002), page 69.

Preferred anodic weights are between 0.5 and 10 g/m$^2$ of $Al_2O_3$, more preferably between 1 and 5 g/m$^2$ of $Al_2O_3$.

A preferred aluminum substrate, characterized by an arithmetical mean center-line roughness Ra less than 0.45 μm is described in EP 1 356 926.

The anodized aluminum support may be subjected to a so-called post-anodic treatment to improve the hydrophilic properties of its surface. For example, the aluminum support may be silicated by treating its surface with a sodium silicate solution at elevated temperature, e.g., 95° C. Alternatively, a phosphate treatment may be applied which involves treating the aluminum oxide surface with a phosphate solution that may further contain an inorganic fluoride. Further, the aluminum oxide surface may be rinsed with a citric acid or citrate solution. This treatment may be carried out at room temperature or may be carried out at a slightly elevated temperature of about 30 to 50° C. A further interesting treatment involves rinsing the aluminum oxide surface with a bicarbonate solution. Still further, the aluminum oxide surface may be treated with polyvinylphosphonic acid, polyvinylmethylphosphonic acid, phosphoric acid esters of polyvinyl alcohol, polyvinylsulfonic acid, polyvinylbenzenesulfonic acid, sulfuric acid esters of polyvinyl alcohol, and acetals of polyvinyl alcohols formed by reaction with a sulfonated aliphatic aldehyde.

Another useful post-anodic treatment may be carried out with a solution of polyacrylic acid or a polymer including at least 30 mol % of acrylic acid monomeric units, e.g., GLASCOL E15, a polyacrylic acid, commercially available from ALLIED COLLOIDS.

Another treatment is the so-called sealing of the micropores as described in WO 2005/111717.

Optimizing the pore diameter and distribution thereof of the grained and anodized aluminum surface as described in EP 1 142 707 and U.S. Pat. No. 6,692,890 may enhance the press life of the printing plate and may improve the resolution of the printing plate. Avoiding large and deep pores as described in U.S. Pat. No. 6,912,956 may also improve the toning behavior of the printing plate.

In the unpublished EP-A 06 110 468 (filed on 2006-Feb.-28) a characterizing method of the surface of a grained and anodized aluminum is disclosed. The parameter 'mean pit depth', calculated according to this characterizing method, correlates with the number and depth of the pits present at the aluminum surface. The mean pit depth of the aluminum surface is preferably less than 2.0 μm, more preferably less than 1.8 μm, most preferably less than 1.5 μm. The standard deviation of the 'mean pit depth' is preferably less than 0.70, more preferably less than 0.50, most preferably less than 0.35.

The grained and anodized aluminum support may be a sheet-like material such as a plate or it may be a cylindrical element such as a sleeve which can be slid around a print cylinder of a printing press.

The support can also be a flexible support, which may be provided with a hydrophilic layer, hereinafter called a 'base layer'. The flexible support is, e.g., paper, plastic film, or aluminum. Preferred examples of plastic film are polyethylene terephthalate film, polyethylene naphthalate film, cellulose acetate film, polystyrene film, polycarbonate film, etc. The plastic film support may be opaque or transparent.

The base layer is preferably a cross-linked hydrophilic layer obtained from a hydrophilic binder cross-linked with a hardening agent such as formaldehyde, glyoxal, polyisocyanate, or a hydrolyzed tetra-alkylorthosilicate. The latter is particularly preferred. The thickness of the hydrophilic base layer may vary in the range of 0.2 to 25 μm and is preferably 1 to 10 μm. More details of preferred embodiments of the base layer can be found in, e.g., EP-A 1 025 992.

The Coating

The coating on the support includes at least one layer including a switchable polymer, the layer hereinafter also referred to as "imaging layer". The coating may further include a light-to-heat converting compound, preferably an IR-absorbing compound, more preferably an IR-dye or an IR-pigment. The coating may further include an intermediate layer between the imaging layer and the support. The coating may also further include a top layer on the imaging layer.

The thickness of the coating preferably ranges between 0.2 and 10 $g/m^2$, more preferably between 0.5 and 5 $g/m^2$, most preferably between 0.8 and 3 $g/m^2$.

The Switchable Polymer

According to a preferred embodiment of the present invention, the imaging layer includes a switchable polymer. The switchable polymer is defined as a polymer which is capable of changing its hydrophilic/hydrophobic polarity by a chemical reaction upon exposure.

According to a preferred embodiment of the present invention, the switchable polymer has a pendant hydrophilic group which is capable of being changed in a hydrophobic group by a chemical reaction upon exposing. In this preferred embodiment, the precursor including this type of switchable polymer is, after image-wise exposing and optionally heating at a temperature in the range of from 70° C. to 150° C. for a period of from 15 to 300 seconds, developed by a gum solution as disclosed above, having a pH ranging preferably between 3 and 9, more preferably between 4 and 8, most preferably between 4 and 7.

According to a more preferred embodiment of the present invention, the switchable polymer has a pendant hydrophobic group which is capable of being changed into a hydrophilic group by a chemical reaction upon exposing.

According to another preferred embodiment of the present invention, the chemical reaction in these pendant groups is directly induced by exposure to light or heating. In another preferred embodiment, an acid is further added to the coating and the acid is capable of catalyzing the chemical reaction in these pendant groups resulting in a hydrophilic/hydrophobic polarity change.

According to another preferred embodiment of the present invention, the chemical reaction in these pendant groups is indirectly induced by exposure to light or heating whereby another compound, present in the coating, undergoes a chemical reaction under the influence of light or heat, thereby further inducing a chemical reaction in the pendant group resulting in a hydrophilic/hydrophobic polarity change. In another preferred embodiment, an acid is formed by a chemical reaction of this other compound under the influence of light or heat and the formed acid catalyses a chemical reaction in the pendant group resulting in a hydrophilic/hydrophobic polarity change. Such compounds which can form an acid under the influence of light or heat are known as a latent Brönsted acid.

The term "latent Brönsted acid" refers to a precursor which forms a Brönsted acid by decomposition. Typical examples of Brönsted acids are sulphonic acids, e.g., trifluoromethane sulphonic acid and hexafluorophosphoric acid.

Ionic latent Brönsted acids are suitable for use in preferred embodiments of the present invention. Examples of these include onium salts, in particular iodonium, sulfonium, phosphonium, selenonium, diazonium, and arsonium salts.

Useful ionic latent Brönsted acids include those represented by the formula:

X+R1R2R3R4W—

When X is iodine, then R3 and R4 are electron lone pairs and R1 and R2 each independently are aryl or substituted aryl groups. When X is S or Se, then R4 is an electron lone pair and R1, R2, and R3 each independently can be an aryl group, a substituted aryl group, an aliphatic group, or a substituted aliphatic group. When X is P or As, then R1, R2, R3, and R4 each independently can be an aryl group, a substituted aryl group, an aliphatic group, or a substituted aliphatic group. W can be BF4, $CF_3SO_3$, $SbF_6$, $CCl_3CO_2$, $ClO_4$, $ASF_6$, $PF_6$, or any corresponding acid whose pH is less than three.

Any of the onium salts described in U.S. Pat. No. 4,708,925 can be utilized as the latent Brönsted acid in a preferred embodiment of the present invention. These include iodonium, sulfonium, phosphonium, bromonium, chloronium, oxysulfoxonium, oxysulfonium, sulfoxonium, selenonium, telluronium, and arsonium salts.

Use of diazonium salts as latent Brönsted acids is particularly preferred. They provide equivalent sensitivity to other latent Brönsted acids in the infrared region and higher sensitivity in the ultraviolet region.

Specific examples of particularly useful onium salts include: diphenyliodonium hexafluorophosphate, triphenylsulfonium hexafluoroantimonate, phenylmethyl-ortho-cyanobenzylsulfonium trifluoromethane sulfonate, and 2-methoxy-4-aminophenyl diazonium hexafluorophosphate.

Non-ionic latent Brönsted acids are also suitable for use in preferred embodiment of the present invention. Examples of these include compounds of the formula:

RCH2X,RCHX2,RCX3,R(CH2X)2 and R(CH2X)3 wherein X is Cl, Br, F, or $CF_3SO_3$ and R is an aromatic group or an aliphatic group.

Further suitable non-ionic latent Brönsted acids are haloalkyl-substituted s-triazines as disclosed in EP-A 672954, o-quinone diazides, photo acid generating agents having an o nitrobenzyl type protective group as described in Polymer Sci., by S. Hayase et al., 25, 573 (1987); the compounds which are subjected to a photodecomposition to generate a sulfonic acid, represented by iminosulfonates as described in Polymer Preprints Japan, by M. Tunooka et al., 35 (8), by disulfon compounds described in JP-Pi 61-166544, by α-sulphonyloxy ketones, by α-hydroxymethylbenzoine sulphonates, by nitrobenzyl sulphonates, by α sulphonyl acetophenones and by sulphonyl imides, the preparation of these last compounds being well known in the literature; the compounds which are subjected to a photodecomposition to generate a phosphonic acid, a partly esterified phosphoric acid or phosphoric acid, represented by nitrobenzylphosphates or phosphonates as described in Tetrahedron Letters, by M. Rubinstein et al., 17, 1445 (1975), by benzoine phosphates or phosphonates, as described in J. Org. Chem. by M. Pirrung and S. Shuey, 59, 3890 (1994), by pyrenemethylphosphates or phosphonates, by iminophosphates or phosphonates and by imidophosphates or phosphonates, the preparation of these last compounds being well known in the literature.

Further, compounds in which the above photosensitive acid precursors are introduced into a primary chain or a side chain of a polymer can be used. Examples thereof include the compounds described in e.g., J. Am. Chem. Soc., by M. E. Woodhouse et al., 104, 5586 (1982); J. Imaging Sci., by S. P. Pappas et al., (5), 218 (1986); etc.

According to another preferred embodiment of the present invention, the switchable polymer is a polymer having pendant groups capable of changing its hydrophilic/hydrophobic polarity by a chemical reaction upon exposure to light or heating, whereby the chemical reaction is catalyzed by an acid present in the coating, or whereby another compound is present in the coating which is capable of in situ forming an acid upon exposing and whereby the chemical reaction in the pendant group is catalyzed by the acid. Such a compound which can form an acid upon exposure are known as a latent Brönsted acid as described above.

In another preferred embodiment, the imaging layer may further include a crosslinking compound or resin in addition to a latent Brönsted acid and the switchable polymer having pendant groups capable of changing its hydrophilic/hydrophobic polarity wherein a chemical reaction between the pendant groups of the switchable polymer and the crosslinking compound or resin is catalyzed by the acid, in situ formed upon exposing, and wherein this reaction results in a crosslinking of the imaging layer in addition to a hydrophilic/hydrophobic polarity change. The switchable polymer used in this preferred embodiment is most preferably a polymer having a pendant hydrophilic group capable of being changed in a hydrophobic group by this chemical reaction upon exposure. In this preferred embodiment, the precursor is imagewise exposed and the imagewise-exposed plate is heated in a step that is referred to as a post-exposure bake or PEB, the heating step is conducted at a temperature in the range of from 70° C. to 150° C. for a period of from 15 to 300 seconds. More preferably, the heating is for a period of from 30 to 90 seconds at a temperature in the range of from 80° C. to 135° C. After the PEB is completed, the plate is processed with a gum solution as described above, having a pH ranging preferably between 3 and 9, more preferably between 4 and 8, most preferably between 4 and 7.

Examples of groups, which undergo a polarity change from hydrophobic to hydrophilic, include t-alkyl carboxylates, e.g., t-butyl esters, as disclosed in EP 249 139; t-alkyl carbonates, e.g., t-butyl carbonates, as disclosed in Polymer Bulletin 17, 1-6 (1987); benzyl carboxylates, e.g., nitrobenzyl or cyanobenzyl esters as disclosed in U.S. Pat. No. 4,963,463; dimethyl benzyl esters as disclosed in Polym. Mater. Sci. Eng. 1989, 60, 142; and alkoxyalkyl esters as disclosed in WO 92/09934 and EP-A 652 483.

Alkoxyalkyl esters as disclosed in WO 92/09934 and in EP-A 652 483 are preferred groups. Polymers derived from tetrahydropyranyl methacrylate as disclosed in EP-A 652 483 and U.S. Pat. No. 6,455,230 are more preferred switchable polymers. The cyclic acetal ester groups are hydrophobic and generate a carboxylic acid upon heating and this reaction is accelerated in the presence of an acid as disclosed in EP 652 483. Examples of compounds capable of forming an acid are the IR-dyes which are capable of generating an acid on radiation as disclosed in EP-A 652 483.

Examples of other groups, which undergo a polarity change from hydrophilic to hydrophobic, include carboxylic acids, sulphonic acids, phosphonic acids, and phenols or their salts, as disclosed in U.S. Pat. No. 6,165,691. Other examples of switchable polymers are polymers containing maleic acid, fumaric acid, itaconic acid, 3- or 4-vinyl phthalic acid, cis-1,2,3,6-tetrahydro phthalic acid or cis-5-norbene-endo-2-,3-dicarboxylic acid, as disclosed in U.S. Pat. No. 6,165,691.

Other examples of switchable polymers are polymers having aryldiazosulphonate group and/or aryltriazenylsulphonate group as disclosed in EP 507 008, EP 339 393, EP-A 1 267 211, EP 960 729, and EP 771 645; polymers having a carboxylic acid or carboxylate group capable of causing thermal decarboxylation as disclosed in EP-A 980 754; polymers having a heat activatable sulphonate group or thiosulphate group as disclosed in EP-A 1 084 861 and U.S. Pat. No. 5,985,514; and polymers having an N-alkylated aromatic heterocyclic group or an organoonium group as disclosed in EP 990 517; and the polymers or systems as disclosed in EP-A 1 046 496, EP-A 1 052 11, EP-A 1 057 622, EP-A 646 476, WO 98/29258, and WO 00/63026.

Examples of a crosslinking compound or resin are amino crosslinking agents. An amino crosslinking agent according to a preferred embodiment of the present invention is preferably a compound obtainable by the condensation of an amino group containing substance and formaldehyde. The amino crosslinking agent has paired functional groups attached to the amino nitrogens. The three most common paired groups may be represented as follows:

—N(CH2OR)2,—N(CH2OH)CH2OR,—N(H)CH2OR where R is generally a low molecular weight alkyl group such as methyl, ethyl, butyl or isobutyl. Preferably the amino crosslinking agent is a compound selected from melamine-formaldehyde resins, (thio)urea-formaldehyde resins, guanamine-formaldehyde resins, benzoguanamine-formaldehyde resins and glycoluril-formaldehyde resins. Some of the compounds are commercially available under the registered trade marks CYMEL or DYNOMIN from Dyno Cyanamid. Another example of a crosslinking compound or resin are resole resins.

The crosslinking compound or resin is preferably incorporated in the coating composition in an amount of from 0.5 to 20 percent by weight, more preferably from 1 to 9 percent by weight, and most preferably from 2.0 to 5.0 percent by weight.

The latent Brönsted acid is preferably incorporated in the coating composition in an amount of from 0.1 to 2 percent by weight, more preferably from 0.25 to 0.9 percent by weight, and most preferably from 0.35 to 0.70 percent by weight.

Other Binders

The imaging layer may further include another binder. This binder can be selected from a wide series of organic polymers. Compositions of different binders can also be used. Useful binders include for example chlorinated polyalkylene (in particular chlorinated polyethylene and chlorinated polypropylene), polymethacrylic acid alkyl esters or alkenyl esters (in particular polymethyl(meth)acrylate, polyethyl(meth)acrylate, polybutyl(meth)acrylate, polyisobutyl (meth)acrylate, polyhexyl(meth)acrylate, poly(2-ethylhexyl)(meth)acrylate and polyalkyl(meth)acrylate copolymers of (meth) acrylic acid alkyl esters or alkenyl esters with other copolymerizable monomers (in particular with (met)acrylonitrile, vinyl chloride, vinylidene chloride, styrene and/or butadiene), polyvinyl chloride (PVC, vinylchloride/(meth)acrylonitrile copolymers, polyvinylidene chloride (PVDC), vinylidene chloride/(meth)acrylonitrile copolymers, polyvinyl acetate, polyvinyl alcohol, polyvinyl pyrrolidone, copolymers of vinyl pyrrolidone or alkylated vinyl pyrrolidone, polyvinyl caprolactam, copolymers of vinyl caprolactam, poly(meth)acrylonitrile, (meth)acrylonitrile/styrene copolymers, (meth)acrylamide/alkyl(meth)acrylate copolymers, (meth)acrylonitrile/butadiene/styrene (ABS) terpolymers, polystyrene, poly(α-methylstyrene), polyamides, polyurethanes, polyesters, methyl cellulose, ethylcellulose, acetyl cellulose, hydroxy-(C1-C4-alkyl)cellulose, carboxymethyl cellulose, polyvinyl formal, and polyvinyl butyral. Particularly preferred binders are polymers having vinylcaprolactam, vinylpyrrolidone or alkylated vinylpyrrolidone as monomeric units. Alkylated vinylpyrrolidone polymers can be obtained by grafting alfa-olefines onto the vinylpyrrolidone polymer backbone. Typical examples of such products are the Agrimer AL Graft polymers commercially available from ISP. The length of the alkylation group may vary from C4 to C30. Other useful binders are binders containing carboxyl groups, in particular copolymers containing monomeric units of α,β-unsaturated carboxylic acids or monomeric units of α,β-unsaturated dicarboxylic acids (preferably acrylic acid, methacrylic acid, crotonic acid, vinylacetic acid, maleic acid or itaconic acid). The term "copolymers" means, in the context of the preferred embodiments of the present invention, polymers containing units of at least 2 different monomers, thus also terpolymers and higher mixed polymers. Particular examples of useful copolymers are those containing units of (meth)acrylic acid and units of alkyl(meth)acrylates, allyl(meth)acrylates and/or (meth)acrylonitrile as well as copolymers containing units of crotonic acid and units of alkyl(meth)acrylates and/or (meth) acrylonitrile and vinylacetic acid/alkyl(meth)acrylate copolymers. Also suitable are copolymers containing units of maleic anhydride or maleic acid monoalkyl esters. Among these are, for example, copolymers containing units of maleic anhydride and styrene, unsaturated ethers or esters or unsaturated aliphatic hydrocarbons and the esterification products obtained from such copolymers. Further suitable binders are products obtainable from the conversion of hydroxyl-containing polymers with intramolecular dicarboxylic anhydrides. Further useful binders are polymers in which groups with acid hydrogen atoms are present, some or all of which are converted with activated isocyanates. Examples of these polymers are products obtained by conversion of hydroxyl-containing polymers with aliphatic or aromatic sulfonyl isocyanates or phosphinic acid isocyanates. Also suitable are polymers with aliphatic or aromatic hydroxyl groups, for example copolymers containing units of hydroxyalkyl(meth) acrylates, allyl alcohol, hydroxystyrene or vinyl alcohol, as well as epoxy resins, provided they carry a sufficient number of free OH groups. Particular useful binders and particular useful reactive binders are disclosed in EP 1 369 232, EP 1 369 231, EP 1 341 040, U.S. 2003/0124460, EP 1 241 002, EP 1 288 720, U.S. Pat. No. 6,027,857, U.S. Pat. No. 6,171,735, and U.S. Pat. No. 6,420,089.

The organic polymers used as binders have a typical mean molecular weight Mw between 600 and 700,000, preferably between 1,000 and 350,000. Preference is further given to polymers having an acid number between 10 to 250, preferably 20 to 200, or a hydroxyl number between 50 and 750, preferably between 100 and 500. The amount of binder(s) generally ranges from 10 to 90% by weight, preferably 20 to 80% by weight, relative to the total weight of the non-volatile components of the composition.

Also, particularly suitable binders are copolymers of vinylacetate and vinylalcohol, preferably including vinylalcohol in an amount of 10 to 98 mol % vinylalcohol, more preferably between 35 and 95 mol %, most preferably 40 and 75 mol %, best results are obtained with 50 to 65 mol % vinylalcohol. The ester-value, measured by the method as defined in DIN 53 401, of the copolymers of vinylacetate and vinylalcohol ranges preferably between 25 and 700 mg KOH/g, more preferably between 50 and 500 mg KOH/g, most preferably between 100 and 300 mg KOH/g. The viscosity of the copolymers of vinylacetate and vinylalcohol are measured on a 4 weight % aqueous solution at 20° C. as defined in DIN 53 015 and the viscosity ranges preferably between 3 and 60 mPa·s, more preferably between 4 and 30 mPa·s, most preferably between 5 and 25 mPa·s. The average molecular weight MW of the copolymers of vinylacetate and vinylalcohol ranges preferably between 5,000 and 500,000 g/mol, more preferably between 10,000 and 400,000 g/mol, most preferably between 15,000 and 250,000 g/mol. Other preferred binders are disclosed in EP 152 819 B1 on page 2 lines 50-page 4 line 20, and in EP 1 043 627 B1 on paragraph [0013] on page 3.

In another preferred embodiment, the polymeric binder may include a hydrophobic backbone, and pendant groups including for example a hydrophilic poly(alkylene oxide) segment. The polymeric binder may also include pendant cyano groups attached to the hydrophobic backbone. A combination of such binders may also be employed. Generally the polymeric binder is a solid at room temperature, and is typically a non-elastomeric thermoplastic. The polymeric binder includes both hydrophilic and hydrophobic regions, which is thought to be important for enhancing differentiation of the printing and non-printing areas by facilitating developability. Generally the polymeric binder is characterized by a number average molecular weight (Mn) in the range from about 10,000 to 250,000, more commonly in the range from about 25,000 to 200,000. The imaging layer may include discrete particles of the polymeric binder. Preferably, the discrete particles are particles of the polymeric binder which are suspended in the coating composition of the imaging layer. Specific examples of the polymeric binders according to this preferred embodiment are described in U.S. Pat. No. 6,899,994, 2004/0260050, U.S. 2005/0003285, U.S. 2005/0170286, and U.S. 2005/0123853. In addition to the polymeric binder of this preferred embodiment, the imaging layer may optionally include one or more co-binders. Typical co-binders are water-soluble or water-dispersible polymers, such as, cellulose derivatives, poly vinyl alcohol, poly acrylic acid poly(meth)acrylic acid, poly vinyl pyrrolidone, polylactide, poly vinyl phosphonic acid, synthetic co-polymers, such as the co-polymer of an alkoxy polyethylene glycol (meth)acrylate. Specific examples of co-binders are described in U.S. 2004/0260050, U.S. 2005/0003285, and U.S. 2005/0123853. Printing plate precursors, the imaging layer of which includes a binder and optionally a co-binder according to this preferred embodiment and described in more detail in U.S. 2004/0260050, U.S. 2005/0003285, and U.S. 2005/0123853, optionally include a topcoat and an interlayer.

Surfactant

Various surfactants may be added into the imaging layer. Both polymeric and small molecule surfactants can be used. Nonionic surfactants are preferred. Preferred nonionic surfactants are polymers and oligomers containing one or more polyether (such as polyethylene glycol, polypropylene glycol, and copolymer of ethylene glycol and propylene glycol) segments. Examples of preferred nonionic surfactants are block copolymers of propylene glycol and ethylene glycol (also called block copolymer of propylene oxide and ethylene oxide); ethoxylated or propoxylated acrylate oligomers; and polyethoxylated alkylphenols and polyethoxylated fatty alcohols. The nonionic surfactant is preferably added in an amount ranging between 0.1 and 30% by weight of the coating, more preferably between 0.5 and 20%, and most preferably between 1 and 15%.

Sensitizer or Light to Heat Converter

The coating composition may also include a sensitizer or a light to heat converter. Preferred sensitizers are violet light absorbing sensitizers, having an absorption spectrum between 350 nm and 450 nm, preferably between 370 nm and 420 nm, more preferably between 390 nm and 415 nm. Particularly preferred sensitizers are disclosed in EP 1 349 006 paragraphs [0007] to [0009], Wo 2005/029187, and WO 2004/047930, including the cited references in these patent applications. Other preferred light to heat converters or sensitizers are infrared light absorbing dyes, having an absorption spectrum between 750 nm and 1500 nm, preferably between 780 nm and 1200 nm, more preferably between 800 nm and 1100 nm, particularly preferred are heptamethinecyane dyes, especially the dyes disclosed in EP 1 359 008 paragraphs [0030] to [0032]. Other preferred sensitizers are blue, green, or red light absorbing sensitizers, having an absorption spectrum between 450 nm and 750 nm. Useful sensitizers or light to heat converters can be selected from the dyes disclosed in U.S. Pat. No. 6,410,205, U.S. Pat. No. 5,049,479, EP 1 079 276, EP 1 369 232, EP 1 369 231, EP 1 341 040, U.S. 2003/0124460, EP 1 241 002, and EP 1 288 720.

Particularly preferred light to heat converting compounds or the sensitizing dyes are the dyes as disclosed in EP 652 483, EP-A 97 203 131, U.S. Pat. No. 6,165,691, EP 980 754, EP 1 084 861, U.S. Pat. No. 5,985,514, EP 990 517, EP 1 046 496, EP 1 052 113, EP 646 476, EP 960 729, and EP 507 008.

Colorant

The imaging layer or another layer of the coating may also include a colorant. The colorant can be present in the imaging layer or in a separate layer below or above the imaging layer. After processing with a gum solution, at least a portion of the colorant remains on the printing areas, and a visible image can be produced by removing the coating, including the colorant, at the non-printing areas in the gum processing.

The colorant can be a dye or a pigment. A dye or pigment can be used as a colorant when the layer, including the dye or pigment, is colored for the human eye.

The colorant can be a pigment. Various types of pigments can be used such as organic pigments, inorganic pigments, carbon black, metallic powder pigments, and fluorescent pigments. Organic pigments are preferred.

Specific examples of organic pigments include quinacridone pigments, quinacridonequinone pigments, dioxazine pigments, phthalocyanine pigments, anthrapyrimidine pigments, anthanthrone pigments, indanthrone pigments, flavanthrone pigments, perylene pigments, diketopyrrolopyrrole pigments, perinone pigments, quinophthalone pigments, anthraquinone pigments, thioindigo pigments, benzimidazolone pigments, isoindolinone pigments, azomethine pigments, and azo pigments.

Specific examples of pigments usable as the colorant are the following (herein C.I. is an abbreviation for Color Index; by a Blue colored pigment it is understood a pigment that appears blue to the human eye; the other colored pigments have to be understood in an analogous way):

Blue colored pigments which include C.I. Pigment Blue 1, C.I. Pigment Blue 2, C.I. Pigment Blue 3, C.I. Pigment Blue 15:3, C.I. Pigment Blue 15:4, C.I. Pigment Blue 15:34, C.I. Pigment Blue 16, C.I. Pigment Blue 22, C.I. Pigment Blue 60 and the like; and C.I. Vat Blue 4, C.I. Vat Blue 60 and the like;

Red colored pigments which include C.I. Pigment Red 5, C.I. Pigment Red 7, C.I. Pigment Red 12, C.I. Pigment Red 48 (Ca), C.I. Pigment Red 48 (Mn), C.I. Pigment Red 57 (Ca), C.I. Pigment Red 57:1, C.I. Pigment Red 112, C.I. Pigment Red 122, C.I. Pigment Red 123, C.I. Pigment Red 168, C.I. Pigment Red 184, C.I. Pigment Red 202, and C.I. Pigment Red 209;

Yellow colored pigments which include C.I. Pigment Yellow 1, C.I. Pigment Yellow 2, C.I. Pigment Yellow 3, C.I. Pigment Yellow 12, C.I. Pigment Yellow 13, C.I. Pigment Yellow 14C, C.I. Pigment Yellow 16, C.I. Pigment Yellow 17, C.I. Pigment Yellow 73, C.I. Pigment Yellow 74, C.I. Pigment Yellow 75, C.I. Pigment Yellow 83, C.I. Pigment Yellow 93, C.I. Pigment Yellow 95, C.I. Pigment Yellow 97, C.I. Pigment Yellow 98, C.I. Pigment Yellow 109, C.I. Pigment Yellow 110, C.I. Pigment Yellow 114, C.I. Pigment Yellow 128, C.I. Pigment Yellow 129, C.I. Pigment Yellow 138, C.I. Pigment Yellow 150, C.I. Pigment Yellow 151, C.I. Pigment Yellow 154, C.I. Pigment Yellow 155, C.I. Pigment Yellow 180, and C.I. Pigment Yellow 185;

Orange colored pigments include C.I. Pigment Orange 36, C.I. Pigment Orange 43, and a mixture of these pigments; Green colored pigments include C.I. Pigment Green 7, C.I. Pigment Green 36, and a mixture of these pigments;

Black colored pigments include: those manufactured by Mitsubishi Chemical Corporation, for example, No. 2300, No. 900, MCF 88, No. 33, No. 40, No. 45, No. 52, MA 7, MA 8, MA 100, and No. 2200 B; those manufactured by Columbian Carbon Co., Ltd., for example, Raven 5750, Raven 5250, Raven 5000, Raven 3500, Raven 1255, and Raven 700; those manufactured by Cabot Corporation, for example, Regal 400 R, Regal 330 R, Regal 660 R, Mogul L, Monarch 700, Monarch 800, Monarch 880, Monarch 900, Monarch 1000, Monarch 1100, Monarch 1300, and Monarch 1400; and those manufactured by Degussa, for example, Color Black FW 1, Color Black FW 2, Color Black FW 2 V, Color Black FW 18, Color Black FW 200, Color Black S 150, Color Black S 160, Color Black S 170, Printex 35, Printex U, Printex V, Printex 140 U, Special Black 6, Special Black 5, Special Black 4A, and Special Black 4.

Other types of pigments such as brown pigments, violet pigments, fluorescent pigments, and metallic powder pigments can also be used as colorant. The pigments may be used alone or as a mixture of two or more pigments as the colorant.

Blue colored pigments, including cyan pigments, are preferred.

The pigments may be used with or without being subjected to a surface treatment of the pigment particles. Preferably, the pigments are subjected to a surface treatment. Methods for the surface treatment include methods of applying a surface coat of resin, methods of applying surfactant, and methods of bonding a reactive material (for example, a silane coupling agent, an epoxy compound, polyisocyanate, or the like) to the surface of the pigment. Suitable examples of pigments with a surface treatment are the modified pigments described in WO 02/04210. Specifically, the blue colored modified pigments described in WO 02/04210 are preferred.

The pigments have a particle size which is preferably less than 10 μm, more preferably less than 5 μm and especially preferably less than 3 μm. The method for dispersing the pigments may be any known dispersion method which is used for the production of ink or toner or the like. Dispersing machines include an ultrasonic disperser, a sand mill, an attritor, a pearl mill, a super mill, a ball mill, an impeller, a dispenser, a KD mill, a colloid mill, a dynatron, a three-roll mill, and a press kneader. Details thereof are described in "Latest Pigment Applied Technology" (CMC Publications, published in 1986).

A dispersing agent may be omitted in the preparation of dispersions of so-called self-dispersing pigments. Specific examples of self-dispersing pigments are pigments which are subjected to a surface treatment in such a way the pigment surface is compatible with the dispersing liquid. Typical examples of self-dispersing pigments in an aqueous medium are pigments which have ionic or ionizable groups or polyethyleneoxide chains coupled to the particle-surface. Examples of ionic or ionizable groups are acid groups or salts thereof such as carboxylic acid group, sulphonic acid, phosphoric acid or phosphonic acid and alkali metal salts of these acids. Suitable examples of self-dispersing pigments are described in WO 02/04210 and these are preferred in the present invention. The blue colored self-dispersing pigments in WO 02/04210 are preferred.

Typically, the amount of pigment in the coating may be in the range of about 0.005 $g/m^2$ to 2 $g/m^2$, preferably about 0.007 $g/m^2$ to 0.5 $g/m^2$, more preferably about 0.01 $g/m^2$ to 0.2 $g/m^2$, most preferably about 0.01 $g/m^2$ to 0.1 $g/m^2$.

The colorant can also be a dye. Any known dyes, such as commercially available dyes or dyes described in, for example, "Dye Handbook" (edited by the Organic Synthetic Chemistry Association, published in 1970) which are colored for the human eye, can be used as the colorant in the coating. Specific examples thereof include azo dyes, metal complex salt azo dyes, pyrazolone azo dyes, anthraquinone dyes, phthalacyanine dyes, carbionium dyes, quinonimine dyes, methine dyes, and the like. Phthalocyanine dyes are preferred. Suitable dyes are salt-forming organic dyes and may be selected from oil-soluble dyes and basic dyes. Specific examples thereof are (herein CI is an abbreviation for Color Index): Oil Yellow 101, Oil Yellow 103, Oil Pink 312, Oil Green BG, Oil Blue GOS, Oil Blue 603, Oil Black BY, Oil Black BS, Oil Black T-505, Victoria Pure Blue, Crystal Violet (CI42555), Methyl Violet (CI42535), Ethyl Violet, Rhodamine B (CI415170B), Malachite Green (CI42000), Methylene Blue (CI52015). Also, the dyes disclosed in GB 2 192 729 may be used as the colorant.

Typically, the amount of dye in the coating may be in the range of about 0.005 $g/m^2$ to 2 $g/m^2$, preferably about 0.007 $g/m^2$ to 0.5 $g/m^2$, more preferably about 0.01 $g/m^2$ to 0.2 $g/m^2$, most preferably about 0.01 $g/m^2$ to 0.1 $g/m^2$.

Printing-Out Agent

The imaging layer or another layer of the coating may also include a printing-out agent, i.e., a compound which is capable of changing the color of the coating upon exposure. After image-wise exposing of the precursor, a visible image can be produced, hereinafter also referred to as "print-out image". The printing-out agent may be a compound as described in EP-A-1 491 356 paragraphs [0116] to [0119] on page 19 and 20, and in U.S. 2005/0008971 paragraphs [0168] to [0172] on page 17. Preferred printing-out agents are the compounds described in Wo 2006/005688, from line 1 page 9 to line 27 page 20. More preferred are the IR-dyes as described in EP 1736312, from line 32 page 5 to line 9 page 32.

Exposure

The image-wise exposing step can be carried out off-press in a plate setter, i.e., an exposure apparatus suitable for image-wise exposing the precursor by a laser such as a laser diode emitting around 830 nm, a NdYAG laser emitting around 1060 nm, a violet laser emitting around 405 nm, or a gas laser such as Ar laser, by digital modulated UV-exposure, e.g., by digital mirror devices, or by a conventional exposure in contact with a mask. In a preferred embodiment of the present invention, the precursor is image-wise exposed by a laser emitting IR-light or violet light.

Gum-Processing

The precursor is developed, preferably in a gumming station, by applying a gum solution to the coating of the precursor, thereby removing the non-printing areas of the imaging layer from the support and gumming the plate in a single step. The gumming station includes preferably at least one gumming unit wherein the gum is applied to the precursor by a spraying, jetting, dipping, or coating technique or by rubbing in with an impregnated pad or by pouring-in, either by hand or in an automatic apparatus.

An example of a spray nozzle which can be used in the spraying technique, is an air assisted spray nozzle of the type SUJ1, commercially available at Spraying Systems Belgium, Brussels. The spray nozzle may be mounted at a distance of 50 mm to 200 mm between the nozzle and receiving substrate. The flow rate of the spray solution may be set to 7 ml/min. During the spray process, an air pressure in the range of 4.80×105 Pa may be used on the spray head. This layer may be dried during the spraying process and/or after the spraying process. Typical examples of jet nozzles which can be used in the jetting technique, are ink-jet nozzles and valve-jet nozzles.

At least one of the gumming units may be provided with at least one roller for rubbing and/or brushing the coating while applying the gum to the coating. The gum used in the developing step can be collected in a tank and the gum can be used several times. The gum can be replenished by adding a replenishing solution to the tank of the gumming unit. In an alternative way, the gum solution may be used once-only, i.e., only starting gum solution is applied to the coating by preferably a spraying or jetting technique. The starting gum solution is a gum solution which has not been used before for developing a precursor and has the same composition as the gum solution used at the start of the development.

The replenishing solution is a solution which may be selected from a starting gum solution, a concentrated gum solution, a diluted gum solution, a solution of a non-ionic surfactant, water, a solution of a buffer having a pH ranging between 4 and 7 or a baking gum. A concentrated or diluted gum solution is a solution including a higher, or respectively, lower concentration of gum additives as defined above. A concentrated gum solution can be added as replenishing solution when the concentration of active products is under a desired level in the gum solution. A diluted gum solution or water can be used when the concentration of active products is above a desired level in the gum solution or when the viscosity of the gum solution is increased or when the volume of the gum solution is under a desired level, e.g., due to evaporation of the solvent or water. A solution of a non-ionic surfactant or a solution of a buffer can be added when the gum solution needs a higher concentration of a surfactant or when the pH of the gum solution needs to be controlled at a desired pH value or at a desired pH value in a range of two pH values, preferably between 3 and 9, more preferably between 4 and 8, most preferably between 4 and 7.

The addition of replenishing solution, i.e., the type and the amount of replenishing solution, may be regulated by the measurement of at least one of the following parameters such as the number and area of plate precursor developed, the time period of developing, the volume in each gumming unit (minimum and maximum level), the viscosity (or viscosity increase) of the gum solution, the pH (or pH change) of the gum solution, the density (or density increase) of the gum solution and the conductivity (or conductivity increase) of the gum solution, or a combination of at least two of them. The density (or density increase) of the gum solution can be measured with a PAAR density meter.

The gum solution used in this step preferably has a temperature ranging between 15° C. and 85° C., more preferably between 18° C. and 65° C., most preferably between 20° C. and 55° C.

In a preferred embodiment of the present invention, the gumming station includes a first and a second gumming unit whereby the precursor is firstly developed in the first gumming unit and subsequently developed in the second gumming unit. The precursor may be firstly developed in the first gumming unit with gum solution which has been used in the second gumming unit, and, subsequently, developed in the second gumming unit with a starting gum solution by preferably a spraying or jetting technique. In an alternative way, the first and second gumming units preferably have the configuration of a cascade system, whereby the gum solution used for developing the precursor in the first and second gumming units are respectively present in a first and a second tank, and whereby the gum solution of the second tank overflows to the first tank when replenishing solution is added in the second gumming unit. Optionally, also to the first gumming unit a replenishing solution can be added and this replenishing solution may be the same or another replenishing solution than added to the second gumming unit, e.g., a diluted gum solution, a solution of a non-ionic surfactant or water can be added as replenisher to the first gumming unit.

In another preferred embodiment of the present invention, the gumming station may include a first, a second, and a third gumming unit whereby the precursor is firstly developed in the first gumming unit, subsequently in the second gumming unit, and finally in the third gumming unit. The precursor may be firstly developed in the first gumming unit with gum solution which has been used in the second gumming unit, subsequently developed in the second gumming unit with gum solution which has been used in the third gumming unit, and finally developed in the third gumming unit with starting gum solution by preferably a spraying or jetting technique. In an alternative way, the first, second, and third gumming units preferably have the configuration of a cascade system, whereby the gum solution used for developing the precursor in the first, second, and third gumming units are respectively present in a first, a second, and a third tank, and whereby the gum solution of the third tank overflows to the second tank when replenishing solution is added in the third gumming unit, and whereby the gum solution of the second tank overflows to the first tank. Optionally, also to the second and/or first gumming unit(s), a replenishing solution may be added and this replenishing solution may be the same or another replenishing solution than added to the third gumming unit, e.g., a diluted gum solution, a solution of a non-ionic surfactant or water can be added as replenisher to the second or first gumming unit. In another option, two different replenishing solutions can also be added to one gumming unit, e.g., a starting gum solution and water.

In another preferred embodiment of the present invention, the gum solution used in each of the gumming units may be regenerated by removing insoluble material present in the gum solution of a gumming unit. The presence of insoluble material in the gum solution may be caused by several reasons, e.g., by developing a pigment containing coating, by evaporation of solvent or water of the gum solution, or by sedimentation, coagulation, or flocculation of components in the gum solution. The insoluble material can be removed continuously or in batch form by several techniques such as filtration, ultra-filtration, centrifugation, or decantation. A suitable apparatus for disposing a waste developing solution such as the gum solution of the preferred embodiments of the present invention is described in EP-A 747 773. The apparatus can be connected to the tank of a gumming unit to regenerate the used gum solution by circulation of the gum solution through a filter or a filter membrane. The gum solution can be circulated over the filter or filter membrane continuously, periodically or during the development time, or the circulation is regulated by the measurement of the turbidity or transparency (i.e., optical transmission) of the gum solution whereby the circulation starts when the turbidity exceeds an upper value and stops when an under value is reached. The upper and under turbidity value can be chosen in relation to the desired degree of purification, generally the optical transmission of the gum solution is not lower than 50% of its value at starting, preferably not lower than 80%, more preferably not lower than 95%.

The Contrast

The contrast of the image formed after image-wise exposure and processing with a gum solution is defined as the difference between the optical density at the printing area to the optical density at the non-printing area, and this contrast is preferably as high as possible. This enables the end-user to establish immediately whether or not the precursor has already been exposed and processed with a gum solution, to distinguish the different color selections and to inspect the quality of the image on the treated plate precursor.

The contrast increases with increasing optical density in the printing area and/or decreasing optical density in the non-printing areas. The optical density in the printing area may increase with the amount and extinction coefficient of the colorant remaining in the printing areas and the intensity of color formed by the printing-out agent. In the non-printing areas it is preferred that the amount of colorant is as low as possible and that the intensity of color print-out agent is as low as possible. The optical density can be measured in reflectance by an optical densitometer, equipped with several filters (e.g., cyan, magenta, yellow). The difference in optical density at the printing area and the non-printing area preferably has a value of at least 0.3, more preferably at least 0.4, most preferably at least 0.5. There is no specific upper limit for the contrast value, but typically the contrast is not higher than 3.0 or even not higher than 2.0. In order to obtain a good visual contrast for a human observer the type of color of the colorant may also be important. Preferred colors for the colorant are cyan or blue colors, i.e., by blue color it is understood to mean a color that appears blue to the human eye.

Drying

According to another preferred embodiment of the present invention, the plate can be dried after the gum-processing step in a drying unit. In a preferred embodiment, the plate is dried by heating the plate in the drying unit which may contain at least one heating element selected from an IR-lamp, a UV-lamp, a heated metal roller, or heated air. In a preferred embodiment of the present invention, the plate is dried with heated air as known in the drying section of a conventional developing machine.

Baking

According to another preferred embodiment of the present invention, the plate can be heated in a baking unit, optionally after drying the plate. In a preferred embodiment of the present invention, when the plate is heated in a baking unit, the precursor is developed by using a baking gum and the gum solution is preferably replenished by adding a replenishing baking gum. The replenishing baking gum is a solution which may be selected from a starting baking gum, i.e., a solution having the same composition as the baking gum used at the start of the development, a concentrated baking gum or a diluted baking gum, i.e., a solution having a higher, or respectively, lower concentration of additives than the starting baking gum, and water.

The baking unit may contain at least one heating element selected from an IR-lamp, a UV-lamp, a heated metal roller, or heated air. The plate is preferably heated in the baking unit at a temperature above 150° C. and less than the decomposition temperature of the coating, more preferably between 200° C. and 295° C., most preferably between 250° C. and 290° C. A longer heating time is usually used when a lower heating temperature is used, and a shorter heating time is used when a higher heating temperature is used. The plate is preferably heated over a time period of less than 10 minutes, more preferably less than 5 minutes, most preferably less than 2 minutes.

In a preferred embodiment of the present invention, the plate is heated by the method as described in EP-A 1 506 854. In another preferred embodiment of the present invention, the plate is heated by the method as described in WO 2005/015318.

In another preferred embodiment of the present invention, the drying step and the heating step may be combined in one single step wherein the plate, after the gum-developing step, is dried and heated in an integrated drying-baking station.

EXAMPLES

Preparation of Aluminum Support S-1

A 0.3 mm thick aluminum foil was degreased by spraying with an aqueous solution containing 34 g/l of NaOH at 70° C. for 6 seconds and rinsed with demineralized water for 3.6 seconds. The foil was then electrochemically grained for 8 seconds using an alternating current in an aqueous solution containing 15 g/l of HCl, 15 g/l of SO42− ions and 5 g/l of A13+ ions at a temperature of 37° C. and a current density of about 120-130 A/$dm^2$. Afterwards, the aluminum foil was desmutted by etching with an aqueous solution containing 145 g/l of sulfuric acid at 80° C. for 5 seconds and rinsed with demineralized water for 4 seconds. The foil was subsequently subjected to anodic oxidation for 10 seconds in an aqueous solution containing 145 g/l of sulfuric acid at a temperature of 57° C. and a current density of 25 A/$dm^2$, then washed with demineralized water for 7 seconds and dried at 120° C. for 7 seconds.

The support thus obtained was characterized by a surface roughness Ra of 0.50-0.65 μm, measured with interferometer NT1100, and had an anodic weight of 3.0 g/$m^2$.

Preparation of Imaging Layers I-1

The coating compositions for the imaging layer I-1 were prepared by mixing the ingredients as specified in Table 1. The resulting solution was coated at a wet coating thickness of 30 μm on the support S-1. After coating, the plate was dried at 60° C. for 5 minutes and has a dry coating thickness of 1.79 g/m2.

TABLE 1

Compositions of the Imaging Layer Solution

| Ingredients | I-1 |
|---|---|
| Switchable polymer-1 (g) | 1.37 |
| IR-dye-1 (g) | 0.123 |
| 1-methoxy-2-propanol (ml) | 25 |

Preparation of Switchable Polymer-1

Switchable polymer-1 is a copolymer of methylmethacrylate, hereinafter also referred to as "MMA", and tetrahydro-2H-pyran-2-yl methacrylic ester, hereinafter also referred to as "THP-methacrylate", in a ratio of 25:75 weight %.

Reaction Scheme:

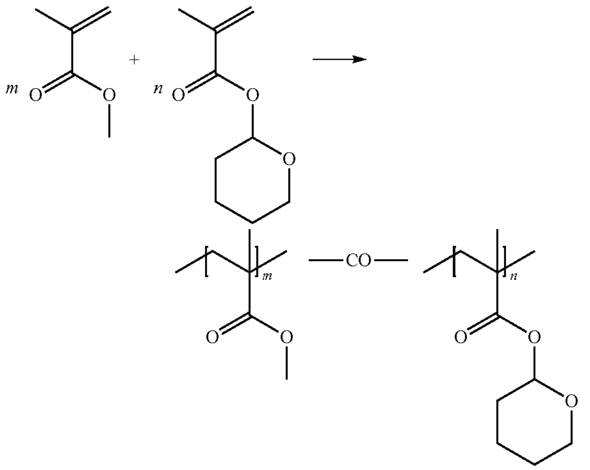

Reaction Procedure

A round bottom flask of 100 ml, equipped with water-cooled condenser, thermometer, nitrogen inlet, and magnetic stirring was placed in a thermostated water bath. 8.44 g of THP-methacrylate, 2.81 g of MMA and 65.53 g of butanone was added to the reactor at room temperature. The reagents and solvent were mixed using a magnetic stirrer and the mixture was flushed with nitrogen at room temperature for 30 minutes. Afterwards, the reaction flask is heated to 70° C. When the reactor temperature reaches 35° C., 0.23 g of 2,2'-azobis(isobutyronitrile) (AIBN) is added. The monomers are reacted for 22 hours at 70° C. Afterwards the reaction mixture is cooled to room temperature and precipitated in 650 ml methanol. The precipitated product is collected via filtration and washed with 100 ml methanol. The product is then dried in a vacuum oven at room temperature. The resulting copolymer has a weight ratio of approximately 75/25 THP-methylate/MMA. The polymer was analyzed using Size Exclusion Chromatography using PS standards and THF as eluent. The polymer showed a Mw=18.3 kg/mol and dispersity index of 1.79 (expresses towards PS standards via universal calibration).

IR-Dye-1 has the Following Structure

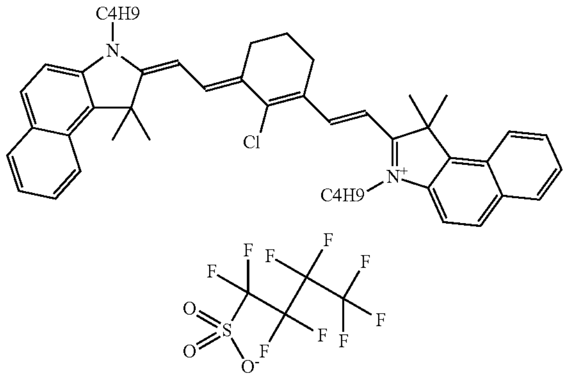

Preparation of the Printing Plate

The precursor was exposed on a High Power Creo 40W SO59 infrared plate setter at an energy of 500 mJ/$cm^2$.

In a Comparative example 1, the printing plate precursor was mounted on a Heidelberg GTO52 printing press after exposure and without processing. A print job was started using K+E Novavit 800 Skinnex ink (trademark of BASF Drucksysteme GmbH) and Primer FS101 (trademark of AGFA) as the fountain liquid, with a compressible blanket, and offset paper. After printing of 5 prints and also after printing 250 prints, the plate was completely ink-accepting and no image formation was observed.

In the Inventive Example 1, the same printing plate precursor was subjected to a gum processing after exposure and before mounting on the press. The gum processing was performed in an Azura C-120 processor with the Gum-1 solution at room temperature.

Gum-1 is a solution prepared as follow:

To 700 g demineralized water 77.3 ml of Dowfax 3B2 (commercially available from Dow Chemical)

32.6 g of trisodium citrate dihydrate, 9.8 g citric acid were added under stirring and demineralized water was further added to 1000 g.

pH is between 4.8 and 5.2

A print job was started on a Heidelberg GTO52 printing press using K+E Novavit 800 Skinnex ink (trademark of BASF Drucksysteme GmbH) and Primer FS101 (trademark of AGFA) as the fountain liquid, with a compressible blanket and offset paper. After printing 5 prints and even after printing 250 prints, a good image without toning was observed.

While preferred embodiments of the present invention have been described above, it is to be understood that variations and modifications will be apparent to those skilled in the art without departing the scope and spirit of the present invention. The scope of the present invention, therefore, is to be determined solely by the following claims.

The invention claimed is:

1. A method of making a lithographic printing plate comprising the steps of:

a) providing a lithographic printing plate precursor including (i) a support having a hydrophilic surface or which is provided with a hydrophilic layer, (ii) a coating on the support including an imaging layer, and, optionally, an intermediate layer between the imaging layer and the support, wherein the imaging layer includes a switchable polymer having a pendant hydrophobic group capable of being changed to a hydrophilic group by a chemical reaction upon exposure;

b) image-wise exposing the coating, wherein the polymer having the pendant hydrophobic group undergoes a chemical reaction induced by the exposing step wherein the pendant hydrophobic group is changed to a hydrophilic group, thereby creating a lithographic image consisting of printing areas and non-printing areas wherein the non-printing areas are removable from the support by a gum solution; and c) developing the precursor by treating the coating of the precursor with the gum solution thereby removing the non-printing areas.

2. A method according to claim 1, wherein the gum solution includes a surface protective compound which remains on the plate after the developing step (c) as a layer including 0.005 $g/m^2$ to 20 $g/m^2$ of the surface protective compound.

3. A method according to claim 1, wherein the pendant group of the switchable polymer is selected from t-alkyl carboxylates, t-alkyl carbonates, benzyl carboxylates, dimethyl benzyl esters, or alkoxyalkyl esters.

4. A method according to claim 1, wherein the gum solution has a pH ranging between 3 and 9.

5. A method according to claim 1, wherein the coating further includes an acid capable of catalyzing the chemical reaction in the pendant group.

6. A method according to claim 1, wherein the coating further includes a compound capable of in situ forming an acid upon exposure and the acid is capable of catalyzing the chemical reaction in the pendant group.

7. A method according to claim 1, wherein the precursor is developed in step (c) with the gum solution in a gumming station, and the gumming station includes at least one gumming unit.

8. A method according to claim 1, wherein the image-wise exposing step is carried out by a laser emitting IR-light and the coating further includes an IR-dye or IR-pigment.

9. A method of making a lithographic printing plate comprising the steps of:

a) providing a lithographic printing plate precursor including (i) a support having a hydrophilic surface or which is provided with a hydrophilic layer, (ii) a coating on the support including an imaging layer, and, optionally, an intermediate layer between the imaging layer and the support, wherein the imaging layer includes a switchable polymer having a pendant hydrophilic group capable of being changed to a hydrophobic group by a chemical reaction upon exposure;

b) image-wise exposing the coating, wherein the polymer having the pendant hydrophilic group undergoes a chemical reaction induced by the exposing step wherein the pendant hydrophilic group is changed to a hydrophobic group, thereby creating a lithographic image consisting of printing areas and non-printing areas wherein the non-printing areas are removable from the support by a gum solution having a pH ranging between 3 and 9; and c) developing the precursor by treating the coating of the precursor with the gum solution having the pH ranging between 3 and 9 thereby removing the non-printing areas.

10. A method according to claim 9, wherein the pendant group of the switchable polymer is selected from carboxylic acids, sulphonic acids, phosphonic acids, or phenols or salts thereof.

11. A method according to claim 9, wherein the gum solution includes a surface protective compound which remains on the plate after the developing step (c) as a layer including 0.005 $g/m^2$ to 20 $g/m^2$ of the surface protective compound.

12. A method according to claim 9, wherein the coating further includes an acid capable of catalyzing the chemical reaction in the pendant group.

13. A method according to claim 9, wherein the coating further includes a compound capable of in situ forming an acid upon exposure and the acid is capable of catalyzing the chemical reaction in the pendant group.

14. A method according to claim 9, wherein the precursor is developed in step (c) with a gum solution in a gumming station, and the gumming station includes at least one gumming unit.

15. A method according to claim 9, wherein the image-wise exposing step is carried out by a laser emitting IR-light and the coating further includes an IR-dye or IR-pigment.

* * * * *